(12) United States Patent
Chen et al.

(10) Patent No.: US 7,585,711 B2
(45) Date of Patent: Sep. 8, 2009

(54) SEMICONDUCTOR-ON-INSULATOR (SOI) STRAINED ACTIVE AREA TRANSISTOR

(75) Inventors: Hao-Yu Chen, Kaohsiung (TW); Fu-Liang Yang, Hsin-chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 395 days.

(21) Appl. No.: 11/497,586

(22) Filed: Aug. 2, 2006

(65) Prior Publication Data
US 2008/0029815 A1 Feb. 7, 2008

(51) Int. Cl.
*H01L 21/00* (2006.01)
(52) U.S. Cl. .................... 438/154; 438/152; 438/155; 438/157; 438/162; 438/163; 438/212; 438/257; 438/268; 257/E21.121
(58) Field of Classification Search ............. 438/199, 438/200, 275, 300, 585, 587, 669, 672, 675, 438/FOR. 168, FOR. 187, FOR. 216, 225, 438/295; 257/18, 204, 206, 288, 289, 347, 257/350, 368, 369, 371, 401, E27.046, E27.108, 257/E21.421, E29.193
See application file for complete search history.

(56) References Cited

U.S. PATENT DOCUMENTS

| 7,335,545 B2* | 2/2008 | Currie | 438/197 |
| 7,381,609 B2* | 6/2008 | Yang et al. | 438/218 |
| 7,402,885 B2* | 7/2008 | Sudo | 257/509 |
| 7,407,860 B2* | 8/2008 | Kim et al. | 438/300 |
| 2005/0035470 A1 | 2/2005 | Ko et al. | |
| 2006/0014366 A1* | 1/2006 | Currie | 438/517 |

FOREIGN PATENT DOCUMENTS

WO   WO2005/096372   10/2005

* cited by examiner

*Primary Examiner*—N Drew Richards
*Assistant Examiner*—Kyoung Lee
(74) *Attorney, Agent, or Firm*—Tung & Associates

(57) ABSTRACT

A selectively strained MOS device such as selectively strained PMOS device making up an NMOS and PMOS device pair without affecting a strain in the NMOS device the method including providing a semiconductor substrate comprising a lower semiconductor region, an insulator region overlying the lower semiconductor region and an upper semiconductor region overlying the insulator region; patterning the upper semiconductor region and insulator region to form a MOS active region; forming an MOS device comprising a gate structure and a channel region on the MOS active region; and, carrying out an oxidation process to oxidize a portion of the upper semiconductor region to produce a strain in the channel region.

42 Claims, 5 Drawing Sheets

SEMICONDUCTOR-ON-INSULATOR (SOI) STRAINED ACTIVE AREA TRANSISTOR

FIELD OF THE INVENTION

This invention generally relates to microelectronic integrated circuit (IC) semiconductor devices and fabrication processes and more particularly to strained channel transistors formed on semiconductor-on-insulator (SOI) substrates having improved charge carrier mobility formed according to an improved process flow not requiring epitaxy.

BACKGROUND OF THE INVENTION

With increasing demands for advanced semiconductor transistor structures, the use of dopants to control conduction of charge carriers in the conduction channel of CMOS devices is reaching its limits. As CMOS devices are scaled to the nanometer regime, SOI structures including fully depleted (FD) and partially depleted (PD) structures have provided an evolutionary pathway for MOSFETS operating at low power. However, SOI devices can exhibit the problem of self-induced heating, which can be exacerbated by reduced charge mobility in a transistor channel region.

Mechanical stresses are known to play a role in charge carrier mobility which affects several critical parameters including Voltage threshold (VT) shift, drive current saturation (IDsat), and ON/Off current. The effect of induced mechanical stresses to strain a MOSFET device channel region, and the effect on charge carrier mobility is believed to be influenced by complex physical processes related to acoustic and optical phonon scattering. Ideally, an increase in charge carrier mobility will also increase a drive current.

For example, prior art processes have proposed lattice constant mismatch epitaxy to induce a stress on channel regions to form strained channel regions. Some of the shortcomings of this approach include the fact that the level of induced strain can be relaxed in subsequent thermal heating processes, including self-induced heating effects, thereby reducing device performance. In addition, the manufacturing process typically requires complex and costly epitaxial growth process flows, typically requiring several epitaxial growth processes. Moreover, the lattice constant mismatch between materials, which is relied for producing a stress on the channel regions, can lead to junction leakage, reducing device reliability and performance.

In addition, while it is known that a tensile strained channel region improves electron mobility in an NMOS device, hole mobility in a PMOS device may be improved or degraded by both tensile or compressive strain depending on the magnitude of the strain. Therefore introducing appropriate levels of different types of strain into PMOS and NMOS device channel regions on a single process wafer remains a challenge.

There is therefore a need in the semiconductor device integrated circuit (IC) processing art to develop improved strained channel SOI devices and methods for forming the same to improve device performance as well as improving a process flow.

It is therefore an object of the invention to provide improved strained channel SOI devices and a method for forming the same to improve device performance as well as improving a process flow, while overcoming other shortcomings and deficiencies of the prior art.

SUMMARY OF THE INVENTION

To achieve the foregoing and other objects, and in accordance with the purposes of the present invention, as embodied and broadly described herein, the present invention provides a selectively strained MOS device such as selectively strained PMOS device making up an NMOS and PMOS device pair without affecting a strain in the NMOS device.

In a first embodiment, the method includes providing a semiconductor substrate comprising a lower semiconductor region, an insulator region overlying the lower semiconductor region and an upper semiconductor region overlying the insulator region; patterning the upper semiconductor region and insulator region to form a MOS active region; forming an MOS device comprising a gate structure and a channel region on the MOS active region; and, carrying out an oxidation process to oxidize a portion of the upper semiconductor region to produce a strain in the channel region.

These and other embodiments, aspects and features of the invention will be better understood from a detailed description of the preferred embodiments of the invention, which are further described below in conjunction with the accompanying Figures.

DETAILED DESCRIPTION OF THE PREFERRED EMBODIMENTS

Although the method of forming SOI structures of the present invention is particularly advantageous in the selective formation of a compressive strained channel PMOS device without affecting a strain adjacent NMOS devices, it will be appreciated that separate processes may be carried out to additionally selectively form a tensile strain in the channel region of the adjacent NMOS devices.

Figure 1A:
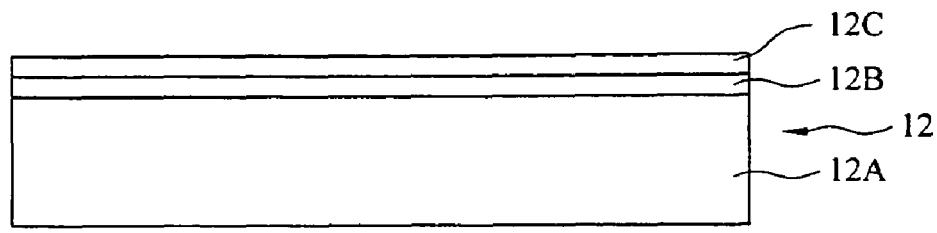
FIGS. 1A-1F are cross sectional side views of an exemplary strained channel SOI NMOS and PMOS device pair at stages in manufacture according to an embodiment of the present invention.

For example, referring to FIG. 1A is shown a cross sectional view of an exemplary portion of a semiconductor-on-insulator (SOI) substrate. A semiconductor substrate 12, for example silicon, is provided where an electrical insulator region 12B, preferably a buried oxide (BOX) region, is formed underlying the surface of the semiconductor substrate, to form lower semiconductor region 12A, and upper semiconductor region 12C. The buried oxide (BOX) layer (region) 12B, may be formed by conventional methods, for example where the level of the implant energy determines the depth and thickness of the BOX region 12B. For example, a high energy (e.g., 200-1000 keV) implant of oxygen ions into the semiconductor substrate 12 followed by a high temperature anneal at about 1200° C. to about 1350° C. is one method to form a BOX region. It will be appreciated that other methods as are known in the art may be used to form the insulator region 12B. For example, the buried oxide (BOX) region (layer) 12B is produced having a thickness of between about 100 Angstroms and about 5000 Angstroms, more preferably less than about 200 Angstroms (20 nm). The upper semiconductor portion 12C may have a thickness of from about 50 Angstroms to about 2000 Angstroms. It will be appreciated that the desired thickness of the BOX layer 12B and the upper semiconductor substrate portion 12C may vary depending on the desired device (transistor) size, and device operating parameters.

Still referring to FIG. 1A, it will be appreciated that the semiconductor substrate 12 is doped according to ion implantation to form P-doped regions (P-well) and N-doped regions (N-well) for respectively forming NMOS devices (transistors) and PMOS devices (transistors) over the doped regions.

Figure 1B:
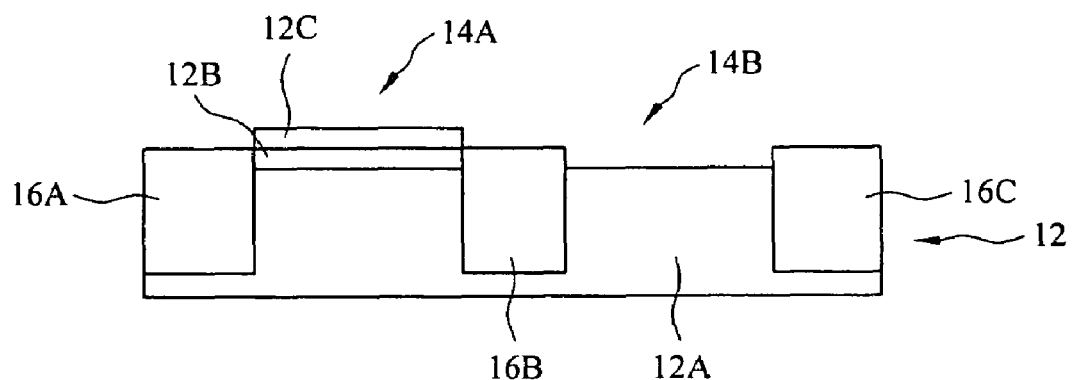

Referring to FIG. 1B, a conventional patterning process, for example lithographic patterning and etching, is carried out to etch through a thickness of the upper semiconductor region portion 12C, and BOX region portion 12B to form a PMOS device active region 14A protruding (raised) above the semiconductor substrate portion 12A and an NMOS device region 14B co-planar with the semiconductor substrate portion 12A.

In one embodiment, the thickness of the buried oxide (BOX) layer (region) 12B thickness is less than about 20 nm. Advantageously, the preferred thinness of the Box layer makes subsequent selective epitaxial growth over the NMOS device region 14B unnecessary for step height reduction. In addition, the preferred BOX layer 12B thickness generates a relatively higher compressive stress during a subsequent thermal oxidation process outlined below (see FIG. 2E) due to a relatively larger volume expansion (e.g., percent volume expansion) of the BOX layer with respect to an original volume (including thickness) of the BOX layer 12B.

Still referring to FIG. 1B, electrical isolation regions, for example, shallow trench isolation (STI) structures 16A, 16B, and 16C are formed adjacent the respective NMOS and PMOS device regions by conventional processes. For example, a hardmask layer is formed over the substrate followed by patterning and etching of STI trenches in the semiconductor substrate portion 12A. The STI trenches are then filled with an insulator such as silicon oxide, followed by planarization and hardmask removal, preferably to leave an upper portion of the STI oxide filling protruding above the surface of semiconductor region 12A, for example about co-planar with the upper surface of the remaining BOX region 12B in the PMOS active region 14A.

Figure 1C:
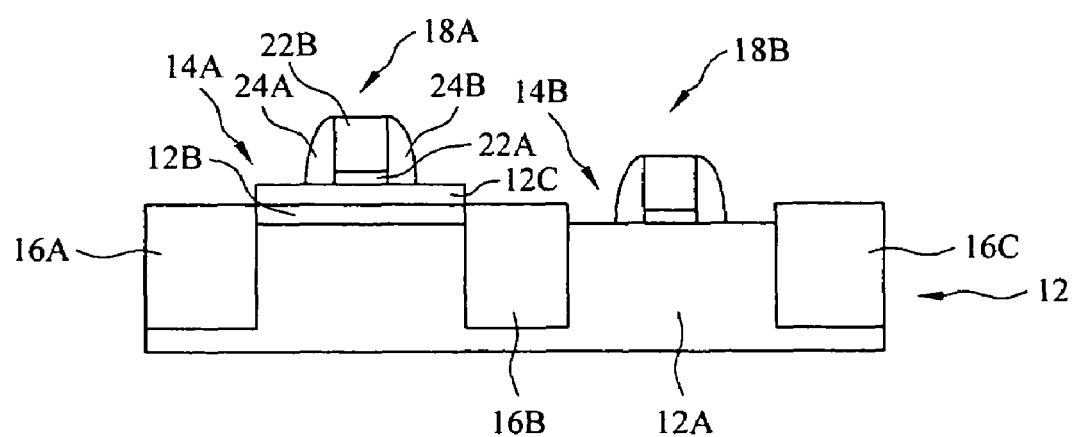

Referring to FIG. 1C, conventional processes are then carried out to form respective PMOS 18A and NMOS 18B devices (transistors) including gate structures on the respective PMOS device region 14A and NMOS device region 14B. For example gate dielectric portions, e.g., 22A, conductive gate electrode portions e.g., 22B, sidewall insulator spacers, e.g., 24A and 24B, are formed using conventional processes and conventional materials. Although sidewall insulator spacers having a partially rounded upper surface are shown for simplicity, it will be appreciated that L-shaped spacers or multiple layered spacers as are known in the art may be formed. It will also be appreciated that LDD doped regions including a halo implant may be formed in the upper semiconductor region 12C immediately adjacent the gate electrode 22B by ion implantation prior to forming the sidewall insulator spacers 24A and 24B.

Figure 1D:
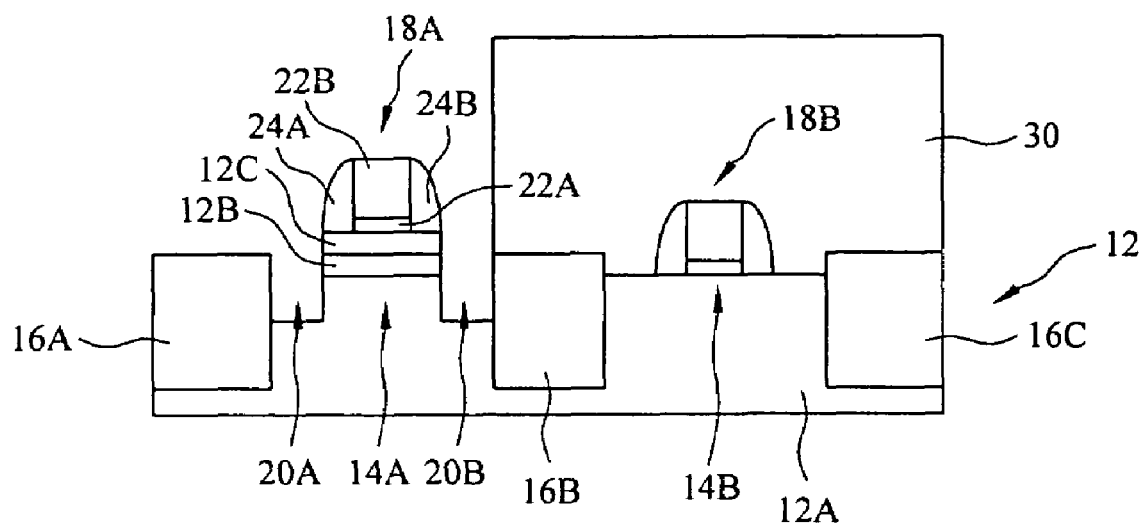

Referring to FIG. 1D, a protective capping layer 30, for example an organic or inorganic material, is formed over the NMOS device region 14B, and preferably being formed to cover the STI structures e.g., 16B and 16C to protect them from etching during a subsequent dry etching process. A dry etching process is then carried out to etch through a thickness portion of the semiconductor substrate portion 12C adjacent either side of the PMOS device 18A to form recessed areas e.g., 20A, 20B between the PMOS device 18A edge and the respective adjacent STI structure edges 16A and 16B.

Figure 1E:
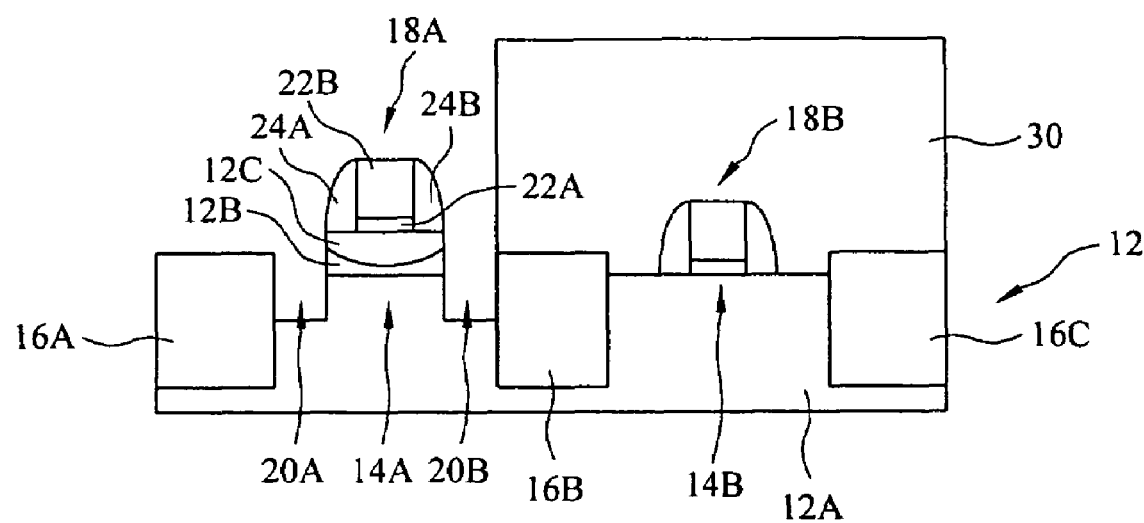

Referring to FIG. 1E, in an important aspect of the invention, a wet and/or dry, preferably a dry oxidation process, is carried out at a temperature of from about 800° C. to about 900° C. whereby a portion of the upper semiconductor region 12C is partially oxidized, including preferentially at an outer portion, together with a volume expansion of the BOX layer 12B to create a compressive stress in the upper semiconductor portion, e.g., silicon portion 12C. The compressive stress includes laterally directed stress field lines with respect to a process surface including a horizontally directed component. For example, during the oxidation process, the partially oxidized portion of the upper silicon portion 12C coalesces with the BOX portion 12B to form an increased volume of an insulator (oxide) portion including the BOX layer 12B to form a bird's beak shaped structure, for example, where the remaining portion of the semiconductor upper region 12C forms a convex downward curvature at an interface with the BOX region 12B. Stated alternatively, the oxidized silicon portion including the BOX layer, referred to as 12B, forms a concave upward curvature at an interface with remaining silicon portion 12C.

Figure 1F:
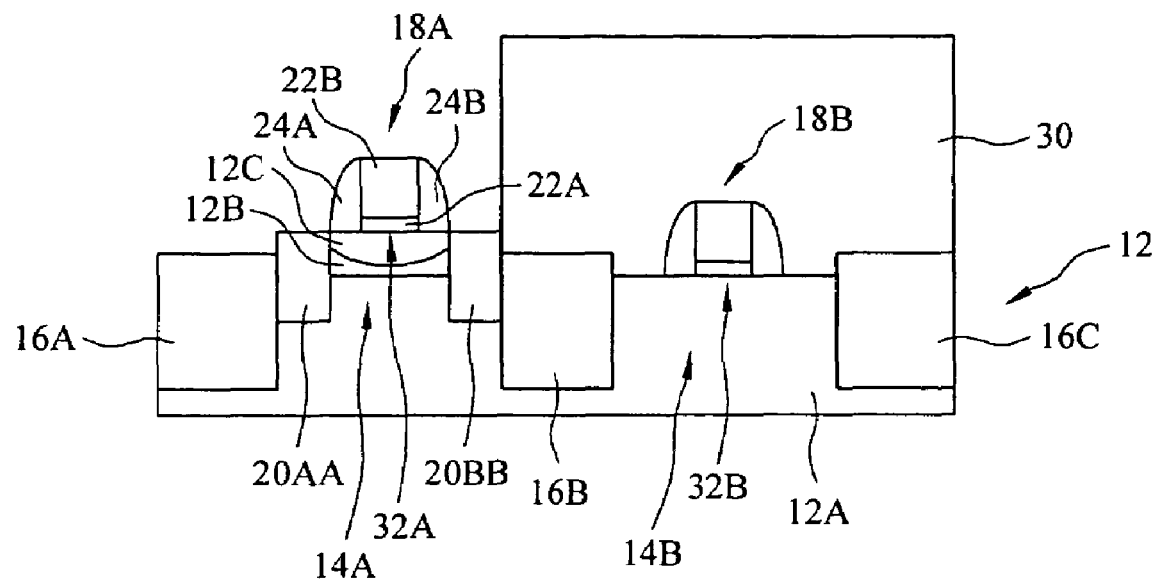

Referring to FIG. 1F, a conventional epitaxial growth process is then carried out to deposit (grow) a semiconductor e.g., Si or optionally, a strained semiconductor alloy, e.g., SiGe, to fill the recessed areas 20A and 20B to form source and drain regions 20AA and 20BB. It will be appreciated that a strained silicon alloy e.g., with a lattice constant larger with respect to the semiconductor substrate, e.g., silicon substrate 12A, may be optionally used to fill the recessed areas 20A and 20B to further increase a compressive strain in the PMOS channel regions e.g., 32A. It will also be appreciated that a P-dopant, such as boron, may be added in-situ during epitaxy or an ion implantation carried out following filling of the recessed areas to reduce an electrical resistance of the source/drain regions.

Following filling the recessed areas 20A and 20B with a semiconductor and/or semiconductor alloy to form source/drain regions 20AA and 20BB, the protective capping layer 30 is then removed. Advantageously, PMOS device 18A is formed to have a compressive strained channel region 32A, while the NMOS device 18B is formed with substantially no induced mechanical strain in the channel region e.g., 32B. It will be appreciated that separate processes may be optionally carried out to produce a tensile strain in the NMOS channel region 32B.

Subsequent conventional processes are then carried out such as salicide formation to reduce an electrical contact resistance on the source/drain region surfaces, where the surface regions are preferably formed of silicon, and an upper portion of the gate electrodes, preferably formed of polysilicon.

Figure 2A:
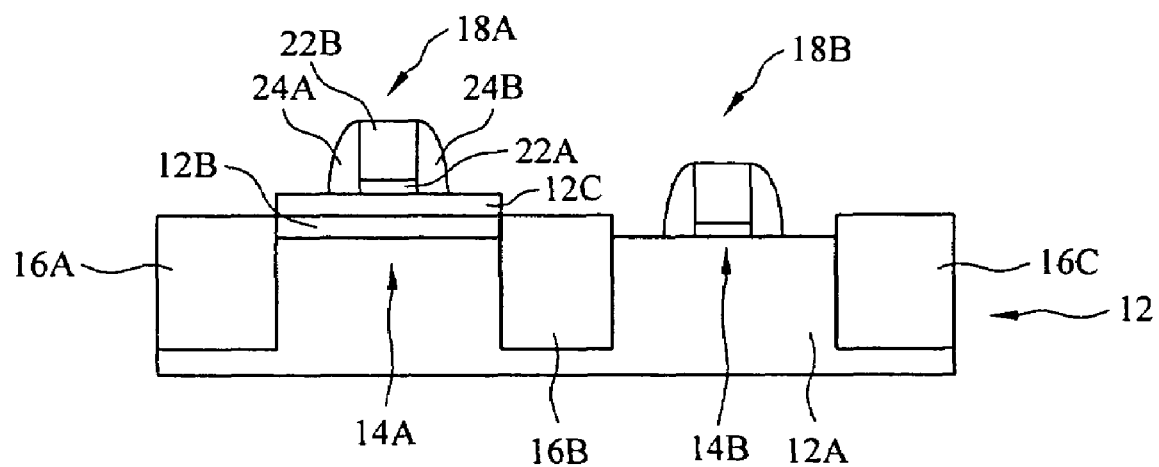
FIGS. 2A-2C are cross sectional side views of an exemplary strained channel SOI NMOS and PMOS device pair at stages in manufacture according to an embodiment of the present invention.

Referring to FIG. 2A, according to another embodiment, similar processes are carried out to arrive at the structure shown in FIG. 2A, similar structures being similarly numbered.

Figure 2B:
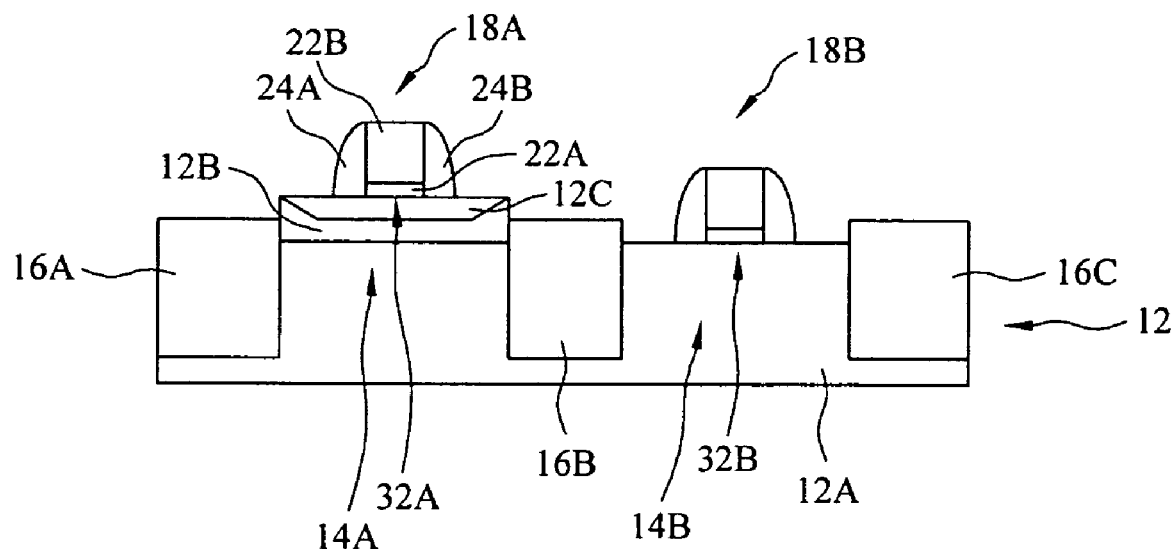

Referring to FIG. 2B, instead of first forming recessed areas, as shown in FIG. 1D, the oxidation process is carried out whereby the upper semiconductor region, e.g., silicon region 12C, is preferentially oxidized at outer portions, to form a thinner compressively strained upper semiconductor region 12C, for example having a bird's beak shape at source/drain regions adjacent opposing sides of the gate structure e.g., 18A.

Advantageously, the thinned bird's beak shaped semiconductor region of 12C remaining following the oxidation process, is formed having a compressive stress laterally directed including a horizontal component, thereby inducing a compressive strain in channel regions 32A underlying the PMOS device 18A.

Figure 2C:
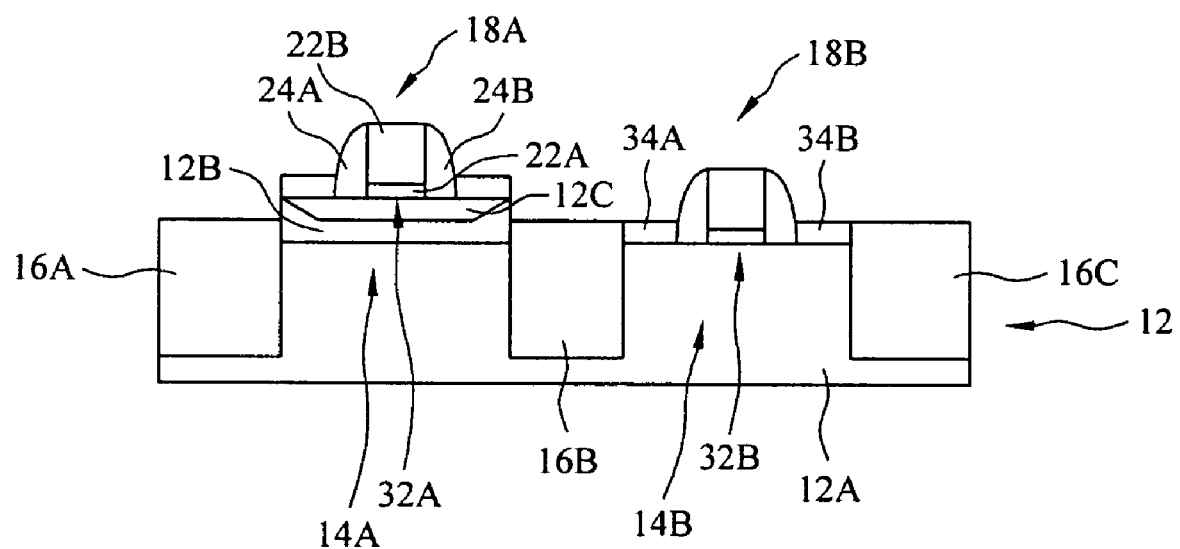

Referring to FIG. 2C, raised source/drain regions e.g., 34A and 34B are then formed adjacent opposing sides of both the PMOS device 18A and NMOS device 18B. For example, a conductive material including a semiconductor or semiconductor alloy may be deposited methods to form source/drain regions extending upward a predetermined height (e.g., 25 to 500 Angstroms) adjacent the sidewall insulator spacers e.g., 24A and 24B.

The raised source/drain regions e.g., 34A and 34B may be formed of silicon and/or a silicon alloy (e.g., silicon-germanium) by selective epitaxial growth (SEG) to increase or maintain a compressive strain in the PMOS device channel region 32A. The raised source/drain regions e.g., 34A and 34B may be either doped in-situ with a P-dopant such as boron or a separate ion implantation process may be carried out following formation of the raised source/drain regions. In addition, formation of the raised source/drain regions adjacent the PMOS device 18A may be formed separately from the formation of source drain regions adjacent NMOS device 18B. For example, the raised source drain regions formed adjacent NMOS device 18B may be formed of a semiconductor e.g., Si or optionally, a tensile strained semiconductor alloy (e.g., lattice constant smaller than Si), such as carbon doped silicon, with an optional N-type dopant being added in-situ or separately. It will further be appreciated that conventional metal salicide formation process may be then optionally carried out to form metal salicides over the source/drain region surfaces for subsequent formation of electrical contacts thereto.

Thus, a method has been presented for selectively forming a compressively strained channel PMOS device where the compressive strain is advantageously selectively formed while not affecting a strain in an NMOS device region. By selectively straining the PMOS device channel region separately from the NMOS device channel region, improved control of a strain level and a desired effect on charge carrier mobility is more effectively realized. In addition, the method for forming strained channel regions does not rely solely on lattice constant mismatch epitaxy for forming the strained regions, although theses methods may be additionally and optionally used. The method of the present invention, by using conventional production processes to form a mechanical strained device channel region, thereby lowers a production cost, improves a process flow, and increases wafer throughput. Moreover, the shortcomings of the prior art including junction leakage at lattice constant mismatch interfaces may be avoided, thereby improving device performance.

Figure 3:
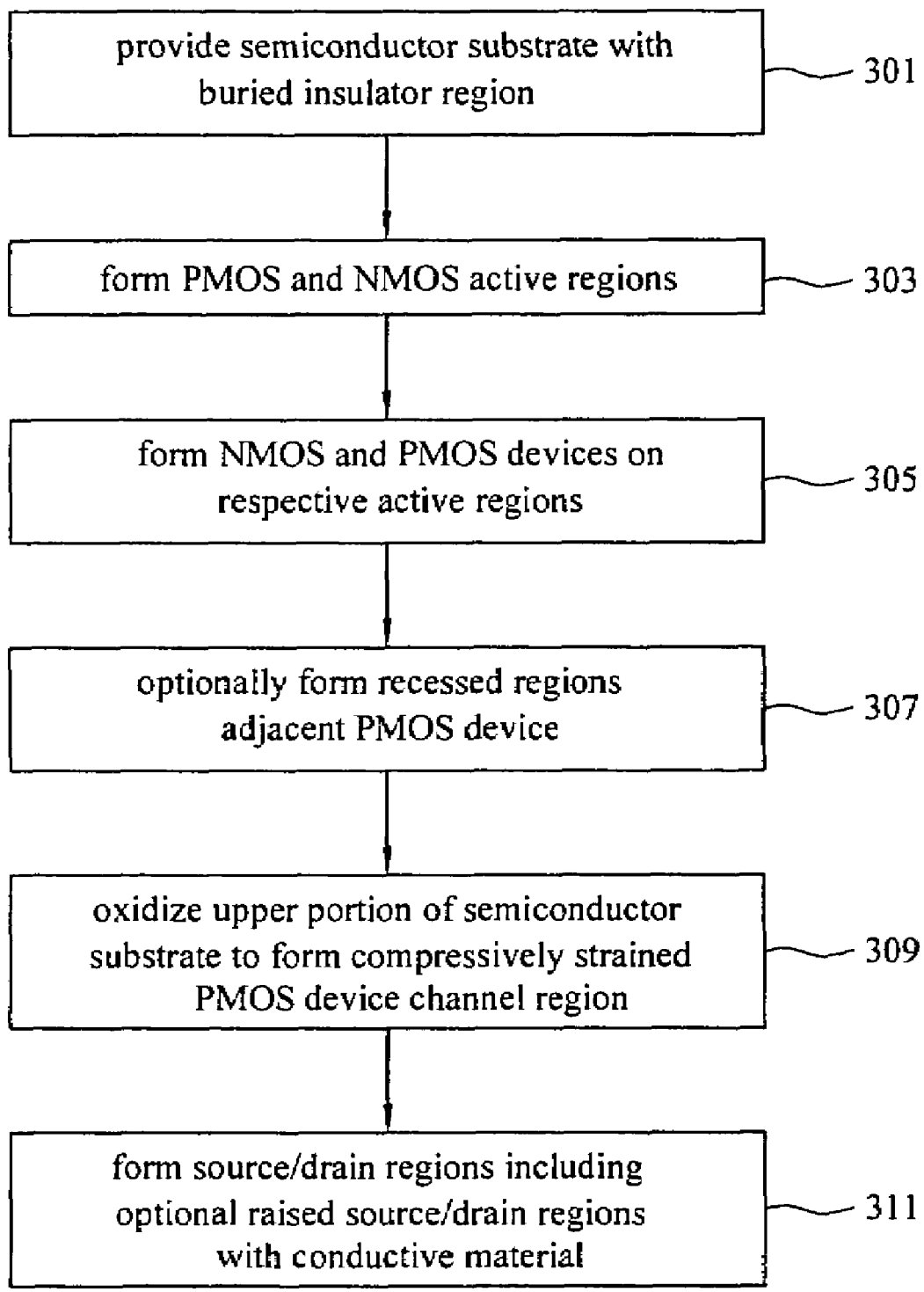
FIG. 3 is a process flow diagram including several embodiments of the present invention.

Referring to FIG. 3 is a process flow diagram including several embodiments of the present invention. In process 301, a semiconductor substrate including a buried insulator (e.g., BOX) region is provided. In process 303, electrically isolated NMOS and PMOS device active regions are formed where the PMOS active region is raised and includes an underlying BOX region portion extending above the process surface. In process 305, NMOS and PMOS gate structures are formed over the respective active regions. In process 307, recessed areas are optionally formed in the source/drain regions adjacent either side of the PMOS gate structure. In process 309, an oxidation process is carried out to oxidize upper portions of the semiconductor substrate underlying the PMOS gate structure to form a compressively strained channel region. In process 311, raised source/drain regions are formed with a conductive material.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method of forming an MOS device with a selectively strained channel region comprising the steps of:
   providing a semiconductor-on-insulator (SOI) substrate comprising a lower semiconductor region, an insulator region overlying the lower semiconductor region and an upper semiconductor region overlaying the insulator region, said upper semiconductor region not comprising an epitaxially strained material;
   patterning the upper semiconductor region and insulator region to form a MOS active region;
   forming the MOS device comprising a gate structure and a channel region on the MOS active region; and,
   carrying out an oxidation process to oxidize a portion of the upper semiconductor region to produce a strain in said upper semiconductor region and the channel region.

2. The method of claim 1, further comprising the step of forming recessed regions adjacent opposing sides of the MOS device prior to the oxidation process.

3. The method of claim 2, wherein the recessed regions extend into the lower semiconductor region.

4. The method of claim 2, further comprising the step of filling the recessed regions with a conductive material following the oxidation process to form source/drain regions.

5. The method of claim 4, wherein the conductive material is selected from the group consisting of a semiconductor and semiconductor alloy.

6. The method of claim 4, wherein the conductive material is selected from the group consisting of silicon and silicon-germanium.

7. The method of claim 1, further comprising the step of forming raised source/drain regions comprising a conductive material following the oxidation process.

8. The method of claim 7, wherein the conductive material is selected from the group consisting of a semiconductor and semiconductor alloy.

9. The method of claim 1, wherein the MOS active region is electrically isolated by adjacent electrical isolation structures.

10. The method of claim 9, wherein the electrical isolation structures are shallow trench isolation (STI) structures.

11. The method of claim 1, wherein the MOS active region is raised above adjacent surfaces.

12. The method of claim 1, wherein the upper and lower semiconductor substrate regions comprise silicon.

13. The method of claim 1, wherein the insulator region comprises a buried oxide (BOX) region.

14. The method of claim 1, wherein the insulator region has a thickness of less than or equal to about 20 nm.

15. The method of claim 1, wherein the MOS device is a PMOS device.

16. The method of claim 15, wherein the strain comprises a compressive strain.

17. The method of claim 1, wherein the MOS device comprises a PMOS device electrically isolated from an adjacent NMOS device formed on an NMOS active region.

18. The method of claim 17, wherein the strain is a compressive strain produced in the PMOS device channel region without affecting a strain in the NMOS device channel region.

19. The method of claim 17, wherein the insulator region is removed over the NMOS device active region.

20. The method of claim 1, wherein the oxidation process is carried out at a temperature less than about 900° C. selected from the group consisting of a dry and a wet oxidation process.

21. A method of selectively forming a strained channel PMOS device comprising a PMOS and NMOS device pair comprising the steps of:
- providing a semiconductor-on-insulator (SOI) substrate comprising a lower semiconductor region, an insulator region overlying the lower semiconductor region and an upper semiconductor region overlying the insulator region, said upper semiconductor region not comprising an epitaxially strained material;
- patterning the upper semiconductor region and insulator region to form a raised PMOS active region;
- forming the PMOS device comprising a gate structure and a channel region on the PMOS active region;
- forming recessed regions adjacent opposing sides of the PMOS device;
- carrying out an oxidation process to oxidize a portion of the upper semiconductor region to produce a compressive strain in said upper semiconductor region and the channel region; and,
- filling the recessed regions with a conductive material to form source/drain regions.

22. A method of selectively forming a strained channel PMOS device comprising a PMOS and NMOS device pair comprising the steps of:
- providing a semiconductor-on-insulator (SOI) substrate comprising a lower semiconductor region, an insulator region overlying the lower semiconductor region and an upper semiconductor region overlying the insulator region, said upper semiconductor region not comprising an epitaxially strained material;
- patterning the upper semiconductor region and insulator region to form a raised PMOS active region;
- forming the PMOS device comprising a gate structure and a channel region on the PMOS active region;
- carrying out an oxidation process to oxidize a portion of the upper semiconductor region to produce a compressive strain in said upper semiconductor region and he channel region; and,
- forming raised source/drain regions comprising a conductive material.

23. A strained channel MOS device comprising:
- an MOS active region comprising a semiconductor-on-insulator (SOI) substrate, said SOI substrate comprising an upper semiconductor region overlying an insulator region, wherein the insulator region overlies a lower semiconductor region, said upper semiconductor region not comprising an epitaxially strained material;
- the MOS device comprising a gate structure and a channel region on the MOS active region; and,
- a partially oxidized upper semiconductor region selectively producing a strain in the channel region.

24. The strained channel MOS device claim 23, further comprising recessed regions filled with a conductive material disposed adjacent opposing sides of the MOS to form source/drain regions.

25. The strained channel MOS device claim 24, wherein the recessed regions extend into the lower semiconductor region.

26. The strained channel MOS device claim 24, wherein the conductive material is selected from the group consisting of a semiconductor and semiconductor alloy.

27. The strained channel MOS device claim 24, wherein the conductive material is selected from the group consisting of silicon and silicon-germanium.

28. The strained channel MOS device claim 23, further comprising raised source/drain regions comprising a conductive material.

29. The strained channel MOS device claim 28, wherein the conductive material is selected from the group consisting of a semiconductor and semiconductor alloy.

30. The strained channel MOS device claim 23, wherein the MOS active region is electrically isolated by adjacent electrical isolation structures.

31. The strained channel MOS device claim 30, wherein the electrical isolation structures are shallow trench isolation (STI) structures.

32. The strained channel MOS device claim 23, wherein the MOS active region is raised above adjacent surfaces.

33. The strained channel MOS device claim 23, wherein the upper and lower semiconductor substrate regions comprise silicon.

34. The strained channel MOS device claim 23, wherein the insulator region comprises a buried oxide (BOX) region.

35. The strained channel MOS device claim 23, wherein the insulator region has a thickness of less than about 20 nm.

36. The strained channel MOS device claim 23, wherein the MOS device is a PMOS transistor.

37. The strained channel MOS device claim 36, wherein the strain comprises a compressive strain.

38. The strained channel MOS device claim 23, wherein the MOS device comprises a PMOS device electrically isolated from an adjacent NMOS device formed on a NMOS active region.

39. The strained channel MOS device claim 38, wherein the strain is a compressive strain selectively disposed in the PMOS device channel region without affecting a strain in the NMOS device.

40. The strained channel MOS device claim 38, wherein the NMOS device is on the lower semiconductor region.

41. A selectively strained channel PMOS device comprising a PMOS and NMOS device pair comprising:
- a PMOS active region comprising a semiconductor-on-insulator (SOI) substrate, said SOI substrate comprising an upper semiconductor region overlying an insulator region, wherein the insulator region overlies a lower semiconductor region, said upper semiconductor region not comprising an epitaxially strained material;
- the PMOS device comprising a gate structure and a channel region on the MOS active region; and,
- a partially oxidized upper semiconductor region selectively producing a compressive strain in the channel region; and,
- recessed regions filled with a conductive material disposed adjacent opposing sides of the PMOS device to form source/drain regions.

42. A selectively strained channel PMOS device comprising a PMOS and NMOS device pair comprising:
- a PMOS active region comprising a semiconductor-on-insulator (SOI) substrate, said SOI substrate comprising an upper semiconductor region overlying an insulator region, wherein the insulator region overlies a lower semiconductor region, said upper semiconductor region not comprising an epitaxially strained material;
- the PMOS device comprising a gate structure and a channel region on the MOS active region; and,
- a partially oxidized upper semiconductor region selectively producing a compressive strain in the channel region; and,
- raised source/drain regions comprising a conductive material.

* * * * *